United States Patent
Liney et al.

(10) Patent No.: US 6,937,030 B2
(45) Date of Patent: Aug. 30, 2005

(54) TESTING ELECTRICAL INTEGRITY OF ELECTRICALLY HEATED SUBSEA PIPELINES

(75) Inventors: David J. Liney, Chester (GB); David M. March, Houston, TX (US)

(73) Assignee: Shell Oil Company, Houston, TX (US)

( * ) Notice: Subject to any disclaimer, the term of this patent is extended or adjusted under 35 U.S.C. 154(b) by 0 days.

(21) Appl. No.: 10/290,555

(22) Filed: Nov. 8, 2002

(65) Prior Publication Data

US 2004/0100273 A1 May 27, 2004

(51) Int. Cl.$^7$ .......................... G01R 27/32; G01R 31/11
(52) U.S. Cl. ........................................ 324/642; 324/533
(58) Field of Search ................................ 324/637, 642, 324/534, 527, 532, 535, 647; 219/39, 40

(56) References Cited

U.S. PATENT DOCUMENTS

| | | | |
|---|---|---|---|
| 972,308 A | 10/1910 | Williamson | |
| 1,231,202 A | 6/1917 | Saylor | |
| 2,096,279 A | 10/1937 | Karcher | 255/28 |
| 2,178,720 A | 11/1939 | Daniels | 219/47 |
| 2,206,831 A | 7/1940 | Berthelsen | 74/440 |
| 2,217,857 A | 10/1940 | Byck | 166/21 |
| 2,224,403 A | 12/1940 | Lines | 219/39 |
| 2,306,831 A | 12/1942 | Proctor | 219/39 |
| 2,660,249 A | 11/1953 | Jakosky | 166/17 |
| 2,678,377 A | 5/1954 | Justiz | 219/40 |
| 2,714,930 A | 8/1955 | Carpenter | 166/60 |
| 2,757,738 A | 8/1956 | Richey | 166/39 |
| 2,851,197 A | 9/1958 | Colton | 222/146 |
| 2,982,354 A | 5/1961 | Green | 166/60 |
| 3,184,958 A | 5/1965 | Eaton | 73/40.5 |
| 3,388,724 A | 6/1968 | Mowell et al. | 138/149 |
| 3,423,570 A | 1/1969 | Trabilcy | 219/301 |
| 3,432,186 A | 3/1969 | Braun | 285/53 |
| 3,439,075 A | 4/1969 | Bauer et al. | 264/45 |
| 3,507,330 A | 4/1970 | Gill | 166/248 |
| 3,515,837 A | 6/1970 | Ando | 219/10.49 |
| 3,547,193 A | 12/1970 | Gill | 166/248 |
| 3,556,218 A | 1/1971 | Talley, Jr. et al. | 166/265 |

(Continued)

FOREIGN PATENT DOCUMENTS

| | | | |
|---|---|---|---|
| EP | 107070907 | 1/2001 | ........... F16L/59/14 |
| GB | 2084284 | 7/1982 | ........... F16L/53/00 |
| SU | 569815 | 9/1977 | |
| WO | 103122 | 4/1937 | |
| WO | 1359445 | 4/1972 | ........... F16L/25/00 |
| WO | 1437587 | 7/1974 | ........... F16L/13/10 |
| WO | 1532730 | 10/1976 | ........... F16L/25/01 |

OTHER PUBLICATIONS

U.S. Appl. No. 09/910,295, Bass, filed Feb. 3, 2004.
Direct Impedance Heating of Deepwater Flowlines, OTC 11037, A. B. Hansen, T. L. Clasen, R. M. Bass, 1989 OTC, pp. 691–701.

(Continued)

Primary Examiner—Anjan Deb
Assistant Examiner—Amy He
(74) Attorney, Agent, or Firm—William E. Hickman (57) ABSTRACT

Method is provided for testing electrically heated subsea pipelines that are "electrical-ready," that is, equipped for applying electrical power when it is needed for heating the pipeline at any time during the life of the pipeline. Time domain reflectometer apparatus in a water-tight enclosure can be deployed subsea. Electrical connections are made with the pipeline using wet-mateable connectors. Reflected signals from the segment of the pipeline being tested are transmitted to an interface at the surface, where the time domain reflectometer is controlled to send a selected pulse. Reflected signals may be interpreted by observing pulse form and time of receipt or by comparison of pulse forms received at different times during the life of a pipeline. Apparatus for electrically connecting a time domain reflectometer to an electrical-ready pipeline is provided.

11 Claims, 6 Drawing Sheets

U.S. PATENT DOCUMENTS

| | | | |
|---|---|---|---|
| 3,605,888 A | 9/1971 | Crowson et al. | 166/248 |
| 3,614,986 A | 10/1971 | Gill | 166/303 |
| 3,620,300 A | 11/1971 | Crowson | 166/248 |
| 3,630,038 A | 12/1971 | Ando | 61/72.1 |
| 3,642,066 A | 2/1972 | Gill | 166/248 |
| 3,706,872 A | 12/1972 | Trabilcy | 219/300 |
| 3,789,188 A | 1/1974 | Rudbarg | 219/301 |
| 3,859,503 A | 1/1975 | Palone | 219/278 |
| 3,885,595 A | 5/1975 | Gibson et al. | 138/155 |
| 3,933,031 A | 1/1976 | Uhlarik | 73/40.5 R |
| 3,935,632 A | 2/1976 | Maxson | 29/455 R |
| 3,944,262 A | 3/1976 | Stiner et al. | 285/53 |
| 3,958,636 A | 5/1976 | Perkins | 166/248 |
| 3,975,617 A | 8/1976 | Othmer | 219/300 |
| 3,981,181 A | 9/1976 | Ochiai | 73/40.5 |
| 3,983,360 A | 9/1976 | Offermann | 219/301 |
| 4,010,799 A | 3/1977 | Kern et al. | 166/248 |
| 4,011,652 A | 3/1977 | Black | 29/455 R |
| 4,017,102 A | 4/1977 | Henderson | 285/41 |
| 4,140,179 A | 2/1979 | Kasevich et al. | 166/248 |
| 4,142,093 A | 2/1979 | Offermann | 219/301 |
| 4,319,632 A | 3/1982 | Marr, Jr. | 166/60 |
| 4,401,162 A | 8/1983 | Osborne | 166/248 |
| 4,450,711 A | 5/1984 | Claude | 73/40.5 R |
| 4,496,174 A | 1/1985 | Mcdonald et al. | 285/53 |
| 4,522,578 A | 6/1985 | Martin, Jr. et al. | 425/110 |
| 4,553,023 A | 11/1985 | Jameson et al. | 219/301 |
| 4,590,971 A | 5/1986 | Webster | 138/149 |
| 4,644,780 A | 2/1987 | Jeter | 73/40.5 |
| 4,645,906 A | 2/1987 | Yagnik et al. | 219/301 |
| 4,667,505 A | 5/1987 | Sharp | 73/40.5 R |
| 4,684,786 A | 8/1987 | Mann et al. | 219/297 |
| 4,716,960 A | 1/1988 | Eastlund et al. | 166/60 |
| 4,768,455 A | 9/1988 | Maxson et al. | 114/264 |
| 4,831,324 A | 5/1989 | Asakura et al. | 324/57 R |
| 4,839,644 A | 6/1989 | Safinya et al. | 340/854 |
| 4,861,074 A | 8/1989 | Eastlund et al. | 285/53 |
| 4,874,925 A | 10/1989 | Dickenson | 249/301 |
| 4,970,467 A | 11/1990 | Burnett | 324/637 |
| 4,992,001 A | 2/1991 | Harrison | 405/166 |
| 4,996,879 A | 3/1991 | Kruka et al. | 73/592 |
| 5,072,622 A | 12/1991 | Roach et al. | 73/40.5 R |
| 5,172,730 A | 12/1992 | Driver | 138/104 |
| 5,189,374 A | 2/1993 | Burnett | 324/534 |
| 5,270,661 A | 12/1993 | Burnett | 324/527 |
| 5,289,561 A | 2/1994 | Filho | 392/478 |
| 5,305,798 A | 4/1994 | Driver | 138/98 |
| 5,421,675 A | 6/1995 | Brown et al. | 405/170 |
| 5,464,307 A | 11/1995 | Wilkins | 405/166 |
| 5,490,562 A | 2/1996 | Arnold | 166/267 |
| 5,605,798 A | 2/1997 | Koster | 432/6 |
| 5,801,953 A | 9/1998 | Thoma et al. | 364/487 |
| 5,836,719 A | 11/1998 | Martin et al. | 405/166 |
| 5,905,194 A | 5/1999 | Strong | 73/40.5 R |
| 6,000,438 A | 12/1999 | Ohrn | 138/149 |
| 6,049,657 A | 4/2000 | Sumner | 392/469 |
| 6,058,979 A | 5/2000 | Watkins | 138/149 |
| 6,114,857 A | 9/2000 | Kohl | 324/534 |
| 6,142,707 A | 11/2000 | Bass et al. | 405/158 |
| 6,179,523 B1 | 1/2001 | Langner et al. | 405/169 |
| 6,278,095 B1 | 8/2001 | Bass et al. | 219/629 |
| 6,292,627 B1 | 9/2001 | Gilchrist, Jr. et al. | 392/311 |
| 6,305,429 B1 | 10/2001 | Welch et al. | 138/149 |
| 6,315,497 B1 | 11/2001 | Wittman et al. | 405/158 |
| 6,364,401 B1 | 4/2002 | Kim | 296/194 |
| 6,371,693 B1 | 4/2002 | Kopp et al. | 405/158 |
| 6,382,259 B1 | 5/2002 | Codling | 138/149 |
| 6,509,557 B1 | 1/2003 | Bass | 219/772 |
| 6,686,745 B2 * | 2/2004 | Bass | 324/522 |
| 2003/0015436 A1 | 1/2003 | Bass et al. | 205/740 |
| 2003/0015519 A1 | 1/2003 | Stone, Jr. | 219/494 |
| 2003/0016028 A1 | 1/2003 | Bass | 324/642 |
| 2003/0017007 A1 | 1/2003 | Bass et al. | 405/154.1 |
| 2003/0020499 A1 | 1/2003 | Bass | 324/721 |

OTHER PUBLICATIONS

"Cable–Free Electrical Systems for the Oil to Gas Industry," Production Technologies Company, L.L.C., 600 Kenrick, Suite C–30; Houston, Texas 77060, advertisement, Copyright 1996, 6 pp.

"Dunbar in Depth," Offshore Engineer, Dec. 1994, 2 pp.

"Introduction to Direct Heating of Subsea Pipelines,"overview byStatoil, Saga Petroleum, CSO Norge, Alcatel, Kabel Norge and EFI, Feb. 1988.

"Monolithic Pipeline Electrical Isolation Joints," Hydro-Tech Systems, Inc., Engineered Pipeline Products, advertisement, Nov. 1996, 6 pp.

"New Double Pipe Insulated System (DPIS) Designed by Snamprogetti", Snamprogetti Offshore Division, Viale de Gasperi 16, San Donato Milanese, Milan, Italy, advertisement, 6 pp.

"Skin Effect Pipe Heating Systems," Thermo Systems Technology, Inc. (TST), Four Commerce Park Square, 23200 Chagrin Boulevard, Suite 600, Beachwood, Ohio 44122, Copyright 1991, advertisement, 4 pp.

Stop Paraffin build–up and Realize Your Well's Full Potential . . . Plug in Paratrol. International, Inc. (PTI), 15423 Vantage Parkway East, Houston, Texas 77032, advertisement, Copyright 1989, 6 pp.

"Tubing Casing Wireless Telemetry (Tucas System), "Schlumberger web page (1993?/ Jun. 1996), 16 pp.

A. Anselmi et al., "TTDPIS: A New Underwater Technology in the Field of Traced Insulated Pipelines," 1994 OMAE, vol. 5, Pipeline Technology, ASME, 1994, pp. 69–76.

Anonymous, Insulated Pipe—Precision Engineering, Jun. 2000, The Bayou Bulletin, Issue #8 from www.bayoupip.com/4News/Newslwtter0_8–4.thm, 2 pages.

Anonymous, "Insulated Technique to see first use in North Sea Development", May 17, 1993, Oil and Gas Journal vol. 91, Issue 20, p. 61.

B. J. Eastlund et al., "New System Stops Paraffin Buildup," Petroleum Engineer, Jan. 1989, 3 pp.

Brochure –Combi Pite –the end of clogged pipelines, Alcatel Contracting Norway and Aker Engineering, 7 pp.

Brochure –World Wide Experience List –Compressed Gas Insulated Transmission Bus System Type CGIT, ABB Power T & D Company Inc., 30 Oak Street,Westborough, MA 01581, USA, 6 pp.

C. G. Langer, "Engineering Report—1979 Construction of the Cognac 12–inch Pipeline From Mississippi Canyon Block 194 to Southwest Pass East Bay Central Facilities, Offshore Louisiana,"ES No. 74–82, Job No. 560513, Shell Oil Company, Pipeline Construction Department, *, 6 pp.

Compressed Gas Insulation Transmission Bus Ducts, ABB Power T&D Company, CGIT/PB Division, Westborough, MA, US 22 pages.

DeLuca, "Field of Dreams", Apr. 1, 2001, Offshore Engineering, form www.online.com/news/features/oe/20010401.Fields_0.520.asp, 9 pages.

F. Aarseth and E. Bentsen, "Heating of Pipelines, and Power Supply to Subsea Electrical Equipment," Aker Engineering a.s. A. Bjømstad and B. Knutsen, Alcatel Contracting Norway a.s., DOT 1995, 23 pp.

F. R. Newbold and T. K. Perkins, "Wellbore Transmission of Electrical Power,", The Journal of Canadian Petroleum Technology, Jul.–Sep. 1978, Montreal, pp. 3–52.

F. G. Bosch, K. J. Schmitt, and B. J. Eastlund, "Evaluation of Downhole Electric Impedance Heating systems for Paraffin Control," Paper No. PCIC–90–34 presented at Industry Applications Society 37th Annual Petroleum and Chemical Industry Conference, Houston, Texas, Sep. 10–12, pp. 223–227.

Fred S. Epstein and Gary L. White, "Understanding Impedance Heating,"Chemical Engineering, May 1996, pp. 112–118.

Gaylord, N.G., Gaylord Associates, Newark, New Jersey, "Polymers –Part I. Polyalklene Oxides and Other Polyethers"; Interscience Publishers: New York–London–Syndey, pp. 9–80.

"General Product Specification—Pipeline Insulating Joint," HydroTech Systems, Engineered Pipeline Products, advertisement, pp.

H. Collins and M.A.R. Lyle, Progress Reported in Design of Reelable Insulated Subsea Flow Lines, Oil and Gas Journal, Sep. 24, 1990, p. 102–106.

K. H. Akfhampour, "A Novel Approach to Solving Downhole Fluid Flow Problems by Use of an Electric Heating System", Paper No. PCIC–85–35, 12 pp.

Krevelen, D. W., Univ. of Technology. Delft. The Netherlands, "Properties of Polymers", 3.sup.rd Edition (Revised ), Elsevier; Amsterdam–Oxford–New York–Tokyo, 1990; pp. 641–653.

M. I. Mollison, "Foam Insulation Gets First Reeled Installation off Australia," Oil and Gas Journal, May 18, 1992, pp. 80–82.

Monobloc Insulating Joints Type "IK".

N. B. Carson, "A New Method for Heat Tracing Long Pipelines," ASME, 74–Pet–35, paper presented at the Petroleum Mechanical Engineering Conference, Dallas, Texas, Sep. 15–18, 1974, pp. 2–4.

Protest Document, Dec. 8, 1987 letter of Andrew W. Marr, Jr. to the Assistant Commissioner of Patents requesting issuance of U.S. Appl. No. 4,716,960 available in the file history as of Jan. 5, 1988.

R. Walsh, "Electromagnetic Energy Helps Recovery," Gulf Coast Oil World., Jun. 1986, pp. 18–19.

"Taking Induction Heating Underwater,"Process Heating, Jul./Aug. 1995, 1 p.

The Electrothermic Co. (TEC), 4916 Bear Lane, P.O. Box 4227, Corpus Christi, TX 78408 advertisement/sales brochure, 4 pp.

Anecdote—"Thermo Systems Under River Crossings" discussed in Supplemental Information Disclosure Statement filed on Jun. 22, 2000 for U.S. Appl. No. 08/921,737, filed Aug. 27, 1997, entitled, "Method for Maintaining Well Fluids Within a Shut–In Subsea Pipeline."

Anecdote—"Fuel Oil Between Buildings" discussed in Supplemental Information Disclosure Statement filed on Jun. 22, 2000 for U.S. Appl. No. 08/921,737, filed Aug. 27, 1997, entitled, "Method for Maintaining Well Fluids Within a Shut–In Subsea Pipeline."

Anecdote—"Asphalt Transfer Liner from Tank Cars et al." discussed in Supplemental Information Disclosure Statement filed on Jun. 22, 2000 for U.S. Appl. No. 08/921,737, filed Aug. 27, 1997, entitled, "Method for Maintaining Well Fluids Within a Shut–In Subsea Pipeline."

Production Technologies Company Invention Discosure of R. M. Bass dated July. 24, 1986, "Disclosure for Controlled Paraffin Deposition in Subsea Pipelines" as discussed in Supplemental Information Disclosure Statement filed on Jun. 22, 2000 for U.S. Appl. No. 08/921,737, filed Aug. 27, 1997, entitled "Method for Maintainaing Well Fluids Within a Shut–In Subsea Pipeline.".

Purported Invention Disclosure of Production Technologies Company, L.L.C. (PTC) by Bernard J Eastlund and John Haeber, dated Apr. 28, 1995. Apparatus for Introducing Electric Current into and Offshore Pipeline. 4pp as discussed in Supplemental Information Disclosure Statement filed on Jun. 22, 2000 for U.S. Appl. No. 08/921,737, filed Aug. 27, 1997, entitled "Method for Maintainaing Well Fluids Within a Shut–In Subsea Pipeline."

* cited by examiner

TESTING ELECTRICAL INTEGRITY OF ELECTRICALLY HEATED SUBSEA PIPELINES

BACKGROUND OF THE INVENTION

1. Field of the Invention

The present invention relates to electrically heated subsea pipelines. More particularly, method and apparatus are provided for determining the electrical integrity of subsea pipelines that are equipped with wet-mateable subsea connectors for electrical heating of the pipeline.

2. Description of Related Art

Companies seeking to recover hydrocarbons offshore must often drill wells in water several thousands of feet deep. In many cases, groups of these deep wells feed recovered hydrocarbon fluids into remote platforms via lengthy underwater pipelines resting on the ocean floor. Because these subsea pipelines lay at great depths, the seawater that surrounds them has a temperature in the range of 40° F. The hydrocarbon fluids, however, usually reach the ocean floor from the wells at much greater temperatures. That is, the hydrocarbons arrive at the high temperatures near those typical of depths of thousands of feet below the ocean floor. Thus, the hydrocarbon fluids cool dramatically once they reach the ocean floor. The hydrocarbons are produced with at least small amounts of water. As this water and hydrocarbon fluid mix cools, it can undergo changes that decrease its flow rate through the subsea pipelines. The viscosity of some crude oils increases severely when the oil cools. Other crude oils deposit paraffin on the pipeline walls as they cool. Light hydrocarbon gases under pressure can form crystals called "hydrates" when mixed with water. If these hydrates or paraffin deposits plug pipelines, they can be quite difficult to remove. Hydrate removal methods that work in shallow waters are often ineffective in deep waters. High pressure in the pipeline and uneven ocean floor topography only compound the problem. Any of the problems caused by low seawater temperatures can result in expensive losses in production.

Usually, hydrocarbon fluids move rapidly enough through the pipeline to prevent plug formation. However, if well production stops or slows, plugs may develop. Pipeline operators sometimes heat subsea pipelines to warm recovered hydrocarbon fluids if they reach problematically low temperatures. Bundling pipelines with a separate line of circulating heating fluid has long been practiced in the industry. Heating via electrical methods has also become possible. One such electrical heating method utilizes a pipe-in-pipe pipeline design. An inner pipe carries the recovered hydrocarbons. An outer "casing" pipe concentrically surrounds this inner pipe. The two pipes are electrically connected at one or both ends. Voltage is applied at the opposite end or at the midpoint. Alternating current runs on the exterior surface of the inner pipe and along the interior surface of the casing pipe. The annulus between the pipes contains electrically insulative centralizers and panels. This pipe-in-pipe method of heating is disclosed, for example, in U.S. Pat. No. 6,142,707, issued Nov. 7, 2000, which is incorporated by reference herein. Another configuration for electrical heating is the Single Heated Insulated Pipe ("SHIP") method. In this configuration, power flows along the electrically insulated pipeline and returns through sea water around the line. This method is disclosed in U.S. Pat. No. 6,049,657, which is also incorporated by reference.

Power is only supplied to electrical heating systems for pipelines as necessary to ease hydrocarbon flow. Heating may not be needed until years after initial pipeline construction. Furthermore, once a plug loosens or melts, heat is no longer necessary. Only a segment of a pipeline may require attention. Therefore, apparatus and methods have been developed for deploying pipelines in a configuration called "electrical-ready." Apparatus is provided when the pipeline is deployed to allow a source of electrical power to be applied to a selected segment of the line when heating is needed at that location. This allows considerably lower investment costs and adds flexibility to the operation of pipelines. The apparatus and methods for making subsea pipelines ready for electrical heating (i.e., "electrical-ready") are disclosed in U.S. Pat. No. 6,371,693, which is commonly assigned and incorporated by reference herein. This patent teaches that various configurations of electrically heated pipelines can be made electrical-ready.

Before high voltage (thousands of volts) from a high current source (in excess of 1000 amperes) is applied to heat an electrical-ready subsea pipeline, however, it is preferable that the electrical integrity of the pipeline be known. Any number of events may cause a short circuit in the pipeline. For example, water may leak through the casing (outside) pipe into the space between the casing and the carrier pipe. Short circuits may even result from gross damage to the pipeline that does not actually cause a water leak, such as dents or bends in the casing pipe that cause it to touch the inner pipe or become close enough to allow breakdown when high voltage is applied. Electrical integrity may be compromised from the very beginning of the pipeline's lifetime, during construction because of entrapment of moisture in the annulus. For example, water may enter the segments of the pipeline as they travel to the ocean floor, or as they are welded together. Electrical short circuits may also arise from metallic contamination incurred during the welding process that shorts the two pipes. A contamination event may be sufficient to cause an electrical breakdown when high voltage is applied even if contaminants do not physically bridge the gap between the inner and casing pipelines. Therefore, a reliable electrical integrity check is preferred before any voltage is applied. This may be as the pipeline is installed, to be sure that it is operable at that time, or after a period of operation of the pipeline when heating becomes needed.

A method called "Time Domain Reflectometry," or "TDR," is generally used to locate electrical faults within transmission lines such as cables. Equipment operators apply electrical pulses to the transmission line. The operators then measure how long it takes before reflections of the pulses caused by different structures in the line to return to the input source. Defects in the transmission line cause reflections. The reflection return time directly relates to the location of the structure or defect that caused the reflection. TDR techniques are known in industry and are used to locate defects in cables with a reasonable degree of accuracy (+/−20 feet).

Known electrical integrity checks for pipelines often rely on electrical cables running through the length of the pipeline. For example, U.S. Pat. No. 5,305,798, issued Apr. 26, 1994, uses an encapsulated conductor cable attached to the inner surface of a casing pipe to detect leakage defects. This method only indirectly measures the physical integrity of the pipeline because it actually measures the physical integrity of the cable. Supplying such a cable may be prohibitively expensive for lengthy pipelines and may prevent the line from routine cleaning using gauge or foam pigs. Furthermore, if the pipeline is damaged, the cable may also require repair. Transmission line repair only further increases costs. Also, this system detects leaks, but not various other problems that affect subsea pipelines. At very deep water depths, a repair is deemed almost technically impossible without complete recovery of the flowline to the surface.

U.S. Pat. No. 5,905,194, issued May 18, 1999, discloses a fault detection system that does not require a separate transmission line. This system uses the pipes themselves as electrical conductors. This system, however, requires multiple electrical connections throughout the length of the pipeline. Furthermore, these connections—and the fault detection system in general—are not designed for underwater use. Deepwater pipelines require components specifically constructed to withstand the harsh conditions of the ocean floor environment, especially the large hydrostatic pressure. Furthermore, because this system is not for underwater applications, it detects leaks from inside the pipeline, rather than leaks from outside the pipeline. Therefore, there is a need for an electrical integrity check system fully adapted for use with electrical-ready subsea pipelines. This system should not require a separate signal transmission line or multiple connections along the pipeline.

A commonly assigned application for "Apparatus and Method for Electrical Testing of Electrically Heated Pipe-in-Pipe Pipeline," filed Jul. 20, 2001, Ser. No. 09/910,295, discloses method and apparatus for testing a pipeline before, during and after subsea installation. In one embodiment, a time domain reflectometer (TDR) is electrically connected to the inner pipe of a pipe-in-pipe pipeline and a voltage pulse of less than about 100 volts is applied to the pipeline.

There is a need for an apparatus for making electrical integrity tests of electrically heated subsea pipelines that are "electrical-ready," that is, that are installed and equipped for applying electrical power to a selected segment of the pipeline when it is needed. The electrical integrity apparatus should be operable from a surface location and should provide an indication of the location of a defect in the pipeline. Methods for employing the apparatus are needed to increase the reliability of such pipelines.

SUMMARY OF THE INVENTION

In one embodiment of the present invention, testing for an electrical defect in a segment of an electrical-ready subsea pipeline is conducted by lowering a time-domain reflectometer (TDR) in a water-tight enclosure to near a mid-line connector on the pipeline. A wet-mateable connector makes an electrical connection between the TDR and the mid-line electrical connector. Electrical pulses from the time domain reflectometer (TDR) pass through the mid-line connector and are applied to the inner pipe of the pipeline. The pulses travel in both directions along the segment. Reflected pulses return to the TDR unit, are collected and transmitted to an interface for interpretation. A remotely operated vehicle may be used to place the wet-mateable connector for making electrical contact. A ship may be used to deploy the ROV and water-tight enclosure. In another embodiment, changes in electrical integrity of a segment of an electrical-ready subsea pipeline are observed by applying pulses and observing changes in reflected pulse forms at selected times after the pipeline is installed. In yet another embodiment, apparatus is provided for testing for an electrical defect in an electrical-ready subsea pipeline.

DETAILED DESCRIPTION

Figure 1:
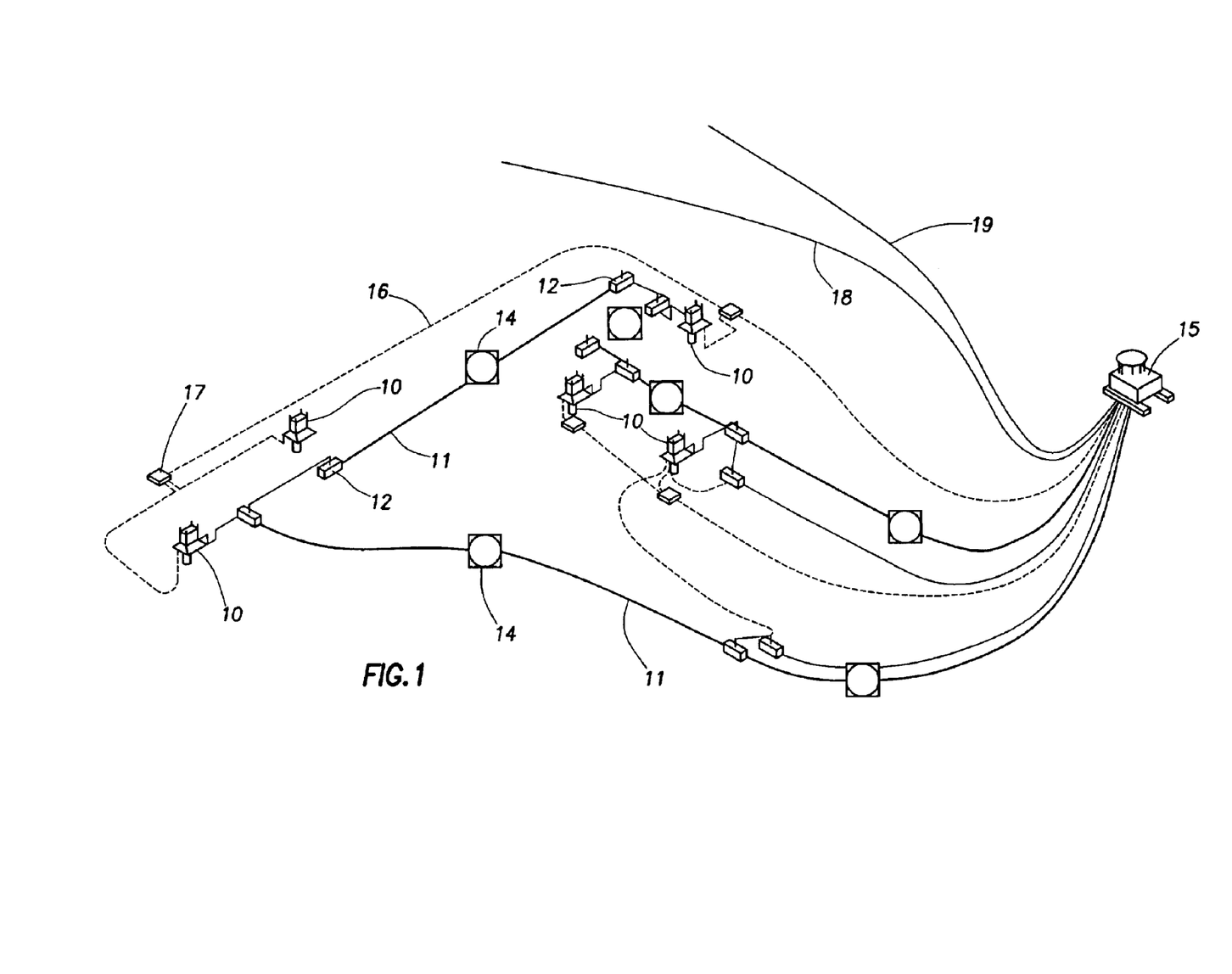
FIG. 1 illustrates a group of wellheads and electrically heated flowlines with control lines on the seafloor connected into a host platform.

FIG. 1 illustrates subsea equipment in an oil or gas field with subsea wells producing to an offshore platform. Wellheads 10 of producing wells are connected to a segment 11 of a pipeline or flowline. Each segment 11 is terminated at each end at sled 12, where a bulkhead is present between the inner and outer pipe. Approximately mid-way along each segment 11 is Mid-Line Electrical Connector (MLEC) 14, which is described below. Segments of a pipeline join and transport fluid from wellheads 10 to platform 15. Control lines 16 from platform 15 are connected to controllers 17 for each well. Fluids from platform 15 are transported to shore or other facilities through oil export line 18 and gas export line 19.

Figure 2A:
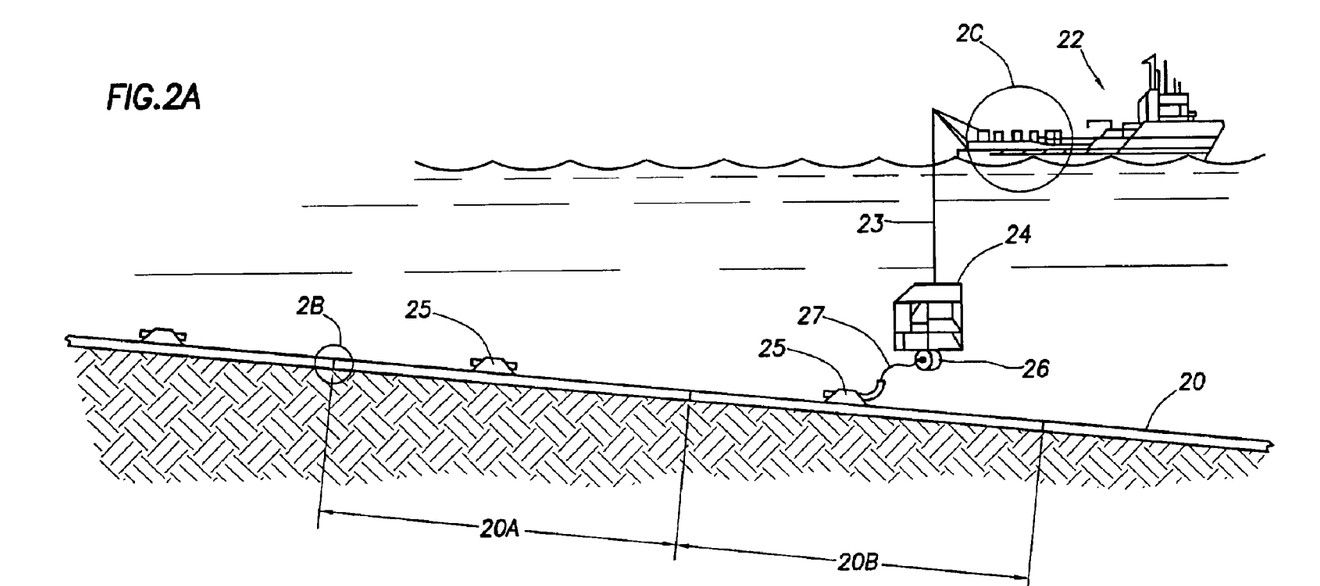
FIG. 2A depicts a configuration of the invention directed to segments of an electrically-ready subsea pipe-in-pipe pipeline with a ship-based electrical integrity check system utilizing a time domain reflectometer (TDR) connected to one segment through a remotely operated vehicle (ROV)
Figure 2B:
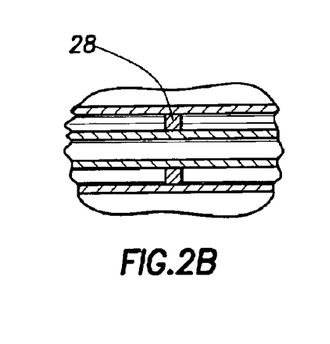
FIG. 2B depicts an example of a bulkhead between the inner and outer pipe of a pipe-in-pipe pipeline.

FIG. 2A illustrates a configuration of the present invention directed to subsea pipe-in-pipe pipeline 20 having segments 20A and 20B. Ship 22 has been moved in place to lower ROV 24 on umbilical 23 to the proximity of mid-line electrical connector (MLEC) 25. Canister 26, which is a water-tight enclosure described in more detail below, has been electrically connected to MLEC 25 through cable 27. In FIG. 2B, details of one end of segment 20A are shown, with an inner pipe and an outer pipe joined by bulkhead 28. The inner pipe serves as the hydrocarbon conduit and electrical conductor, while the outer pipe acts as a protective barrier and electrical conductor. The alternating current is confined to the inner surface of the outer pipe and the outer surface of the inner pipe through the proximity and skin effect phenomena, which are well known in the art. Bulkheads 28 cap the ends of the segment of the pipeline that is to be heated. Bulkheads 28 possess a high electrical conductivity. In a preferred embodiment of the present invention, bulkheads 28 are made of steel joined to the inner and outer pipes. Non-conducting centralizers maintain the inner pipe concentric to the outer pipe. For example, U.S. Pat. No. 6,142,707, issued Nov. 7, 2000, which is incorporated by reference, discloses non-conducting centralizers for use in pipe-in-pipe pipelines. The inner pipe must remain electrically isolated from the outer pipe along the length of pipeline 20, except at bulkheads 28. Direct contact may be prevented by using a plurality of these non-conducting centralizers. U.S. Pat. No. 6,292,627 B1, issued Sep. 18, 2001, which is also incorporated by reference, discloses such bulkheads for use in a pipe-in-pipe pipeline. Non-conducting "water stops" are normally placed at selected intervals in the annulus. The pipe surfaces that form the annulus will also carry the electrical integrity check signal, as detailed below. Any other suitable pipeline analogous to a transmission line may also utilize the electrical integrity check system of the present invention. The electrical integrity check system functions in subsea applications in any depths where the equipment is constructed to withstand external pressures of the water column. Thus, it may be used in conjunction with hydrocarbon pipelines resting on a seabed within the depth rating of the equipment.

Figure 2C:
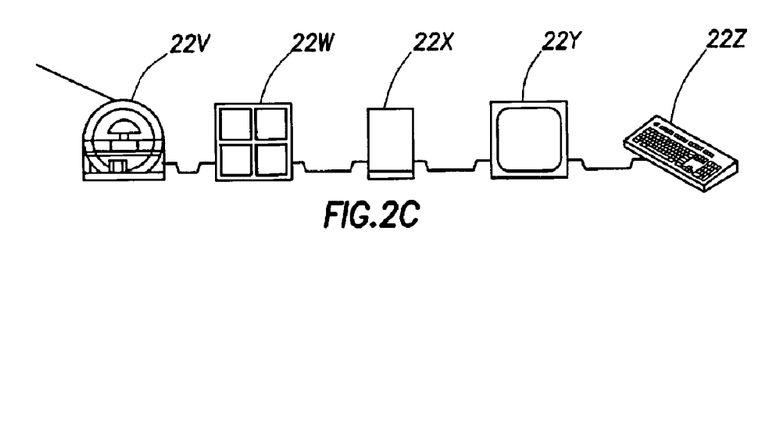
FIG. 2C depicts an example of apparatus on board the ship for lowering and operating the ROV and TDR apparatus.

FIG. 2C shows details of an example of shipboard equipment used for controlling and monitoring the subsea equipment used for testing electrical integrity of an electrical-ready subsea pipeline. Winch 22V with umbilical line 23 supports an ROV, which may be an ROV-of-opportunity. Panel 22W is normally used for controlling and monitoring the ROV. Computer 22X may be programmed with software to monitor, control and/or receive data from a TDR unit in canister 26. Computer 22X may be connected to monitor 22Y, which may serve as the user interface for TDR measurements, and keyboard 22Z.

Figure 3:
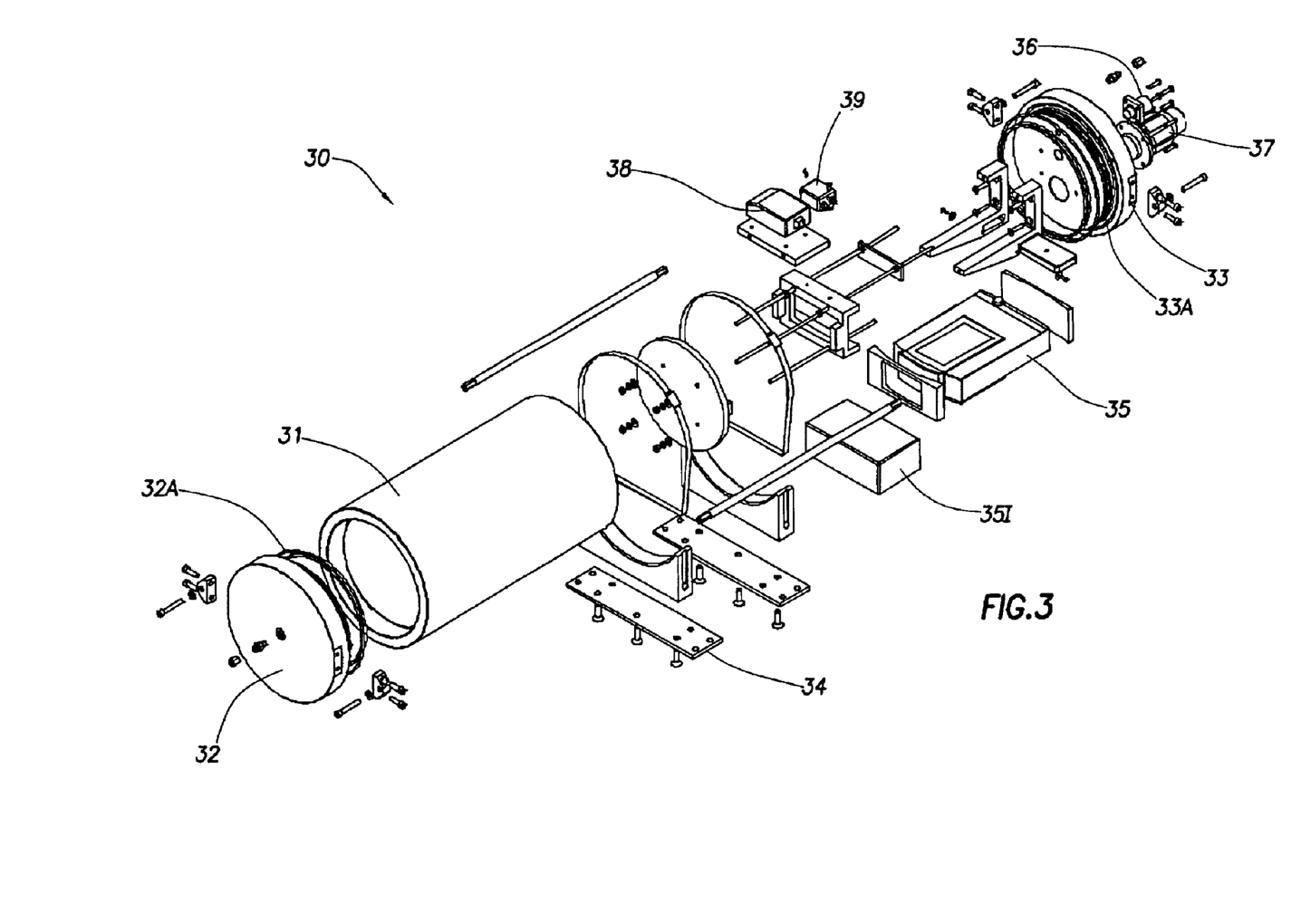
FIG. 3 depicts one embodiment of a one-atmosphere chamber containing a TDR unit and other apparatus.

Referring to FIG. 3, an exploded view of one-atmosphere canister 30, which is a water-tight enclosure, and its contents is shown. Shell 31 and end caps 32 and 33 are designed to withstand hydrostatic pressure at the water depths of the pipelines to be tested. Pipelines are presently placed in water depths of 6000 feet or more, so working external pressure ratings of 3000 psi or more may be needed for some applications. Shell 31 encapsulates the components necessary to send a signal along the annulus of a pipe-in-pipe pipeline and receive any reflected signal. Elastomeric O-rings 32A and 33A ensure a waterproof seal to protect the chamber contents. In a preferred embodiment of the present invention, pressure chamber 30 may be mounted on an ROV via mounting brackets 34. TDR unit 35 is electrically connected through end cap 33 by two plugs. Plug 36 is a Burton plug used to bring electrical power to the unit. Plug 37 is a 12-pin Digitron plug used for transmitting signals to and from the TDR unit. All electrical leads and connections to canister 30 may be designed for underwater usage. Also, these leads and connections may be suitable for operating with an ROV or diver. That is, they may be equipped with a protective jacket and bend-restrictors. They may also be designed such that a robotic arm on an ROV can successfully engage and disengage them.

In an embodiment of the present invention, the contents of the pressure canister 30 may also include TDR power supply 38, power filter 39 and impedance matching unit 35I. A replaceable desiccant pack may also be placed in the canister to absorb moisture. HDW Electronics of Bethlehem, Pa. sells TDR units suitable for use in the present invention. In a preferred embodiment of the present invention, the controlling software (firmware) of the TDR unit is modified to allow the unit to be controlled via its RS232 communications port. This allows settings of the TDR to be altered remotely. This modification may be performed by reprogramming the EEPROM of the unit, as is well known in the art. The internal components of canister 30 may be rigidly attached to mounting brackets that can withstand both drop and vibration damage.

A pipe-in-pipe pipeline may act as a transmission line just as a coaxial cable or twisted pair of wires. A transmission line is characterized by its characteristic impedance, propagation velocity and attenuation. As a pulse propagates along a transmission line it is subjected to attenuation and dispersion that reduces the amplitude and broadens the width of the pulse. Any abrupt change in the characteristic impedance of the transmission line results in the generation of a reflected signal. The shape, amplitude and sign of that reflected signal are dependent on the properties of the change in impedance, its location with respect to the transmitting device and the properties of the transmission line.

The amplitude and sign of a reflected signal arising because of a change in characteristic impedance, expressed as a reflection coefficient, R, are defined as follows $$R = Z_2 - Z_1 / Z_1 + Z_2$$

where $Z_1$ and $Z_2$ are the characteristic impedances of the transmission line at the discontinuity producing the reflected signal. According to this convention, an increase in characteristic impedance then produces a positive reflected signal and a decrease in characteristic impedance as the incident signal moves along the transmission line produces a negative reflected signal. The time between the initial pulse leaving the source and the time the reflected pulse is received is dependent on the location of the change in characteristic impedance and the speed with which the pulse propagates within the pipeline.

Open and short circuits are extreme cases of changes in characteristic impedance of a transmission line. Short circuits are generally present at the ends of a pipe-in-pipe pipeline, where the inner and outer pipes are electrically connected together using steel bulkheads, as shown in FIG. 2B. In the case of a short circuit, $Z_2$ is zero and the reflected signal is 100% of the original with the opposite sign. Therefore, a negative signal should be expected from a pipe-in-pipe pipeline at a time required for a pulse to move to the end of the pipeline and return. Because of attenuation, the reflected signal from the bulkhead of a pipe-in-pipe pipeline segment will be much smaller than the initial signal. It will also be broader, because of dispersion.

The annulus of a pipe-in-pipe pipeline may contain "shear stops" or "water stops" within the annulus. The shear stops are commonly plastic material having a characteristic impedance different from that of the gas-filled or foam-filled portion of the annulus. If the pulse width input to the annulus is much larger than the length of the shear stop, then the amplitude of the reflected signal is negligible. However, the longer the shear stop the greater the effect on the transmitted pulse and the larger the reflection. For a pulse width of 500 ns, for example, a pipeline characteristic impedance of 17.5 ohms and a shear stop having a characteristic impedance of 10 ohms and a length of 15 meters, the reflection coefficient expected is about 27%. This amplitude will be decreased to a value closer to 15% by multiple reflections from each end of the shear stop. There are normally two extended length shear stops in each flowline segment—one located on each side of the mid-line electrical connector.

If the casing or outside pipe is breached, then sea water will flood the annulus space creating a short circuit that will spread from the point of entry to fill the annulus between the water stops. These bulkheads may be spaced a selected number of quads (a quad is four joints of the pipe joined together) apart, such as four quads in some sections of the pipeline and two quads in other sections. The nearest water-tight bulkhead to the TDR end of the pipeline will then produce the reflected signal and no steel bulkhead signal will be obtained because of the attenuation of the signal in the flooded section of the pipeline.

If the casing or outside pipe or if the carrier pipe buckles, then there is a possibility that the two pipes make electrical contact and this will also show up as a short circuit. The short circuit would normally not be located at a water-tight bulkhead.

When a pulse signal is input to a pipeline through a MLEC, the midline connector will normally not be evenly spaced from the ends of the segment. Therefore, the returning pulses from the bulkheads will be separated. There may be a significant broadening of the signals, and consequently wave forms from reflections may be smooth and appear as a flattened sinusoid. Amplitude will depend of course on the mismatch and characteristic impedance between the pipeline and the TDR connection assembly. For asymmetric pipeline sections, the pulse responses from each direction may be completely separate.

Figure 4:
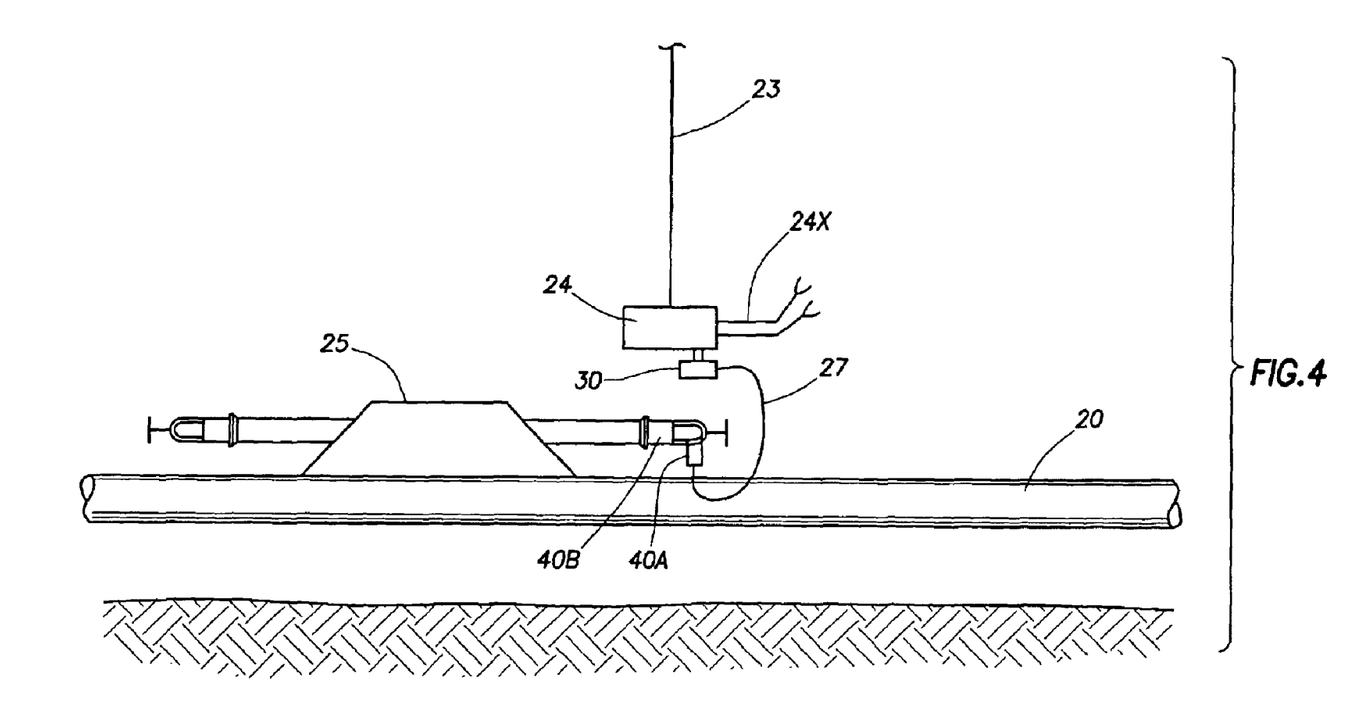
FIG. 4 illustrates a configuration of the invention directed to an ROV with one-atmosphere chamber attached and an electrical connection for TDR to a mid-line electrical connector (MLEC) on a flowline.

Referring to FIG. 4, in one embodiment of the invention ROV 24, supported by umbilical 23, has been lowered to a location in proximity to mid-line electrical connector (MLEC) 25 on pipeline 20. This location may be 6000 feet or more below the water surface. Canister 30, attached to ROV 24, contains TDR unit 35 and other apparatus described above. Cable 27 is connected to canister 30 as described above and terminates in one-half of wet-connector component 40A, which has been removed from a holster on ROV 24 and inserted in matching component 40B of the wet-connector. The design of the wet-mateable assembly allows component 40A to attach to connector receptacle 40B while submerged in seawater with high hydrostatic pressure. Suitable wet-mateable connectors may be purchased from Tronic UK Ltd. of Cumbria, England. Their use is known. However, preferably a standard Tronic plug is slightly modified for use in this invention. Shielded conductor elements in cable 27 may be a bundle of four coaxial cables suitable for underwater use, each with a characteristic impedance of 50 ohms and all four shields of the coaxial cables may be joined together and connected to the casing of plug component 40A. The shields then directly contact the outer pipe (FIG. 2B) because the casing of plug component 40B is in contact with MLEC 25, which attaches to the outside or casing pipe of pipe-in-pipe pipeline 20. The four cores of the coaxial cables join together and connect to the center pin of plug 40A. The resulting cable bundle has a characteristic impedance of 12.5 ohms, which approaches the design characteristic impedance at the MLEC of 8.75 ohms. The flowline has a characteristic impedance of about 17.5 ohms, but is effectively two flowlines in parallel at the MLEC; hence the characteristic impedance at the MLEC is about 8.75 ohms. Alternatively, two 25-ohm coaxial cables joined in the same fashion may be substituted. Because the pipeline may be located on the seabed, all electrical connections—as well as the pipeline itself—must be serviced by either divers or remotely-operated vehicles (ROVs). Divers and ROV units can maneuver and install wet-mateable connector assemblies. The Tronic UK Ltd. plug is suitable for installation and retrieval by ROVs.

To run a check, TDR unit 35 sends pulses through cable 27 to MLEC 25. At the inner pipe, the pulse signal current divides equally and the input voltage pulse propagates in both directions towards electrically-conducting bulkheads 28 (FIG. 2B). The annulus formed between the inner pipe and outer or casing pipe behaves as a transmission line for the pulse signal. Like any component of a transmission line, the annulus has a characteristic impedance. The bulkheads' 28 impedance differs from that of the annulus. Therefore, the pulse reflects once it reaches bulkheads 28. The reflected pulse then travels along the annulus back to the MLEC. TDR unit 35 collects the reflected pulse signal from the MLEC via shielded conductor elements in cable 27.

The characteristic impedances of TDR unit 35 and any connections between the unit and the pipeline preferably match, so as to prevent excess reflections. Canister 30 therefore preferably contains impedance adapter 35I to match the 100-ohm TDR circuitry to the characteristic impedance of the pipe system. Thus, the preferred embodiment of the present invention matches the characteristic impedance of the TDR unit 35 directly to the annulus between inner and casing pipes of the pipeline. The electrical pulse may be optimized to minimize the effects of mismatch between the various non-pipeline components, while maintaining sufficient resolution to locate changes in the pipeline, as discussed below. The longer the pulse width, generally, the greater distance over which problems can be detected. Thus, a range of pulse widths may be used for each section of tested pipeline. Longer pulses generally locate changes close to bulkheads 28, and shorter pulses generally locate defects near the MLEC. Pulse widths and amplitudes may range from about 5 ns to about 5000 ns and about 1 V to about 10 KV, respectively. A preferred range of pulse width is in the range from about 150 ns to about 3000 ns and an amplitude from about 1 V to about 5 V. It is possible to obtain measurements for pipeline segment lengths from short lengths to lengths ranging up to at least 43,000 feet. Thus, once the pulse divides at the inner pipe, a pulse can travel up to at least 21,500 feet to reach a bulkhead. The preferred embodiment of the present example uses pulse widths greater than 50 ns.

TDR unit 35 may also store the reflected pulses. It may send the stored pulse forms to an underwater signal encoder, which may then send the pulse through umbilical 23 to a surface signal decoder for display on graphical user interface monitor 22Y (FIG. 2C). Any form of interface may be used for observing or storing the signals. Graphical user interface 22Y and 22Z may only display the pulse form, but also may allow equipment operators at the surface to control TDR unit 35. In a preferred embodiment of the present invention, the encoder/decoder digital communication protocol may be RS 232 or similar. The software controlling the surface unit may use standard RS 232 communication protocol as well. The communications link on the standard TDR unit made by HDW is designed for downloading pulse forms only. The software to perform this activity is available from the manufacturer of the TDR, HDW Electronics, Inc. Thus, in a preferred embodiment of the present invention, TDR unit 35 and accompanying graphical user interface software have been modified to allow data signals from the surface to travel down to TDR unit 35 at the ocean floor. In a preferred embodiment of the present invention, the pulse forms travel to the surface via umbilical 23, which also powers the TDR unit. Fiber optic communication channels may be used.

The time delay between the emitted pulse and reflected pulse relates to the distances the pulse traveled to the bulkheads and the velocity at which the pulse propagated through the pipeline. If the MLEC is offset from the middle of the pipeline, the pulse form will likely be offset in time in direct relation to this asymmetrical distance to the conducting bulkheads. The characteristics of the pulse path through the pipeline influence the pulse form of the returning signal. Defects in the pipeline leave different "signatures" in the pulse forms. To determine if the pulse path has deteriorated in electrical integrity, the operator may compare a measured pulse form with a baseline pulse form. Thus, operators should make a calibrating reading of the pulse path upon initial construction of the pipeline. This calibrating reading reveals the characteristic impedances of the inner and casing pipes and the bulkheads, as well as the characteristic impedances of the non-conducting, non-ferrous centralizers in the annulus. Measurements taken thereafter will reveal any changes in the impedance of the pulse path. Specifically, defect "signatures" in the pulse form will be apparent when operators compare a current pulse form with the calibrating reading.

Changes in pulse form may arise, for example, from debris or water entering the casing pipe and causing a short circuit. Dents or damage to the casing pipe may also cause short circuits if the casing pipe touches the inner pipe. If water breaches the casing pipe, a short circuit may develop over a section of the pipeline between the adjacent non-conducting centralizers. The pulse reflects when it reaches a water-filled section of the annulus. The reflected signal from this water-filled section arrives earlier than it would had bulkheads generated it. From the current pulse form, the operator can determine that water has breached casing pipe at a particular location. Pulse forms obtained when pipelines contain short circuits exhibit a signature shape, indicating the presence of the short circuit.

This electrical integrity check system can detect various changes along the pipeline. Metallic or water contamination from the welding process may cause short circuits after a time. Uncured polyurethane in the annulus may change the characteristic impedance of the pipeline components. Short circuits may develop even when contamination does not bridge the annular cavity but may be sufficient to cause a breakdown upon the application of an electrical pulse. Pulse forms of contaminated pipelines obtained during construction may exhibit erratic behavior, producing a short circuit signature. Once the pipeline is complete, operators can take a calibrating reading to use for later analyses. Taking measurements throughout the operational life of the pipeline—even when no problem is suspected—may provide an integrity condition record of the pipeline. These additional measurements may also ensure that when a pipeline defect occurs, operators can determine the location of the defect to within a few feet.

Figure 5:
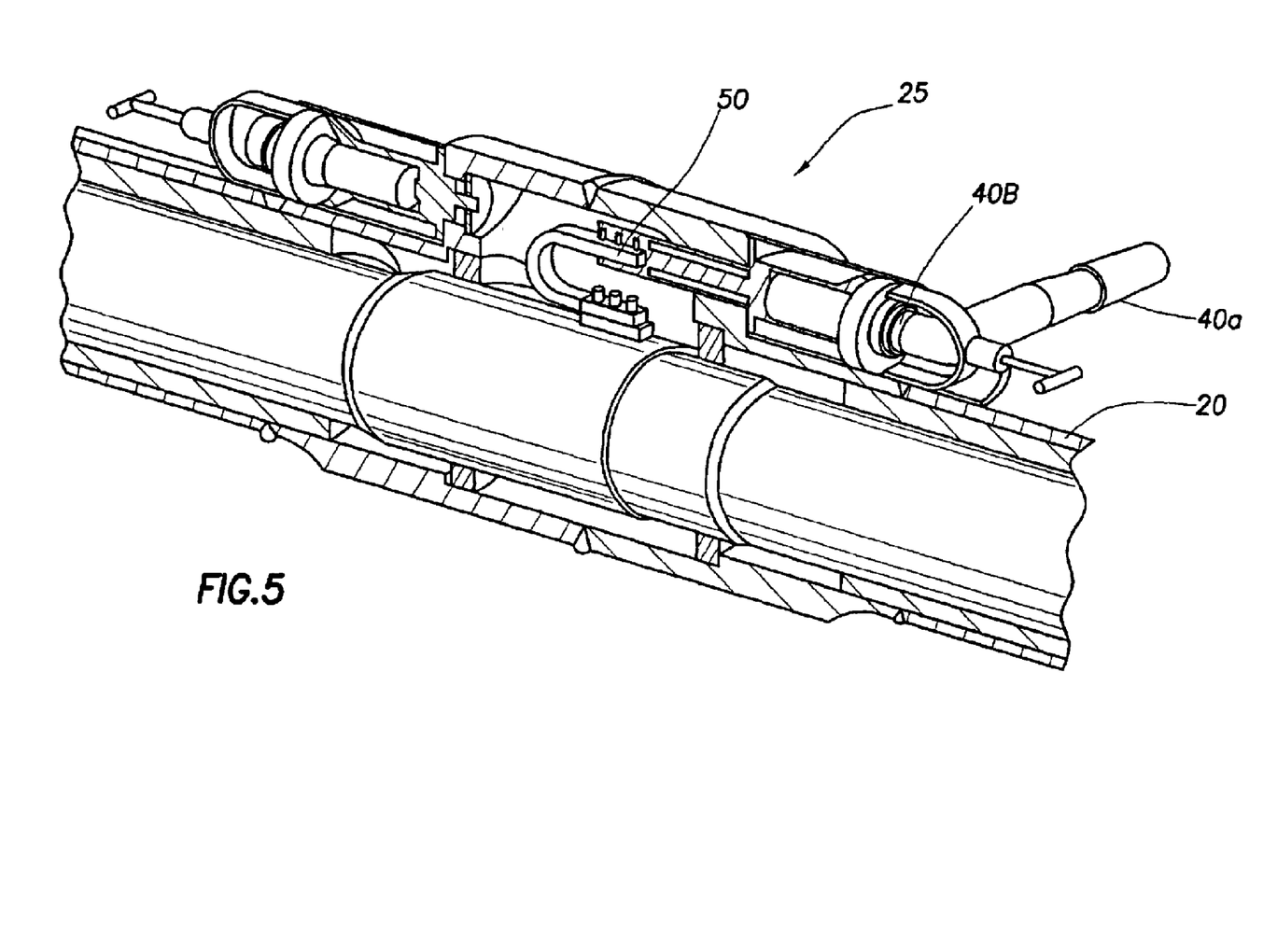
FIG. 5 illustrates a configuration of the invention directed to a mid-line electrical connector (MLEC).

FIG. 5 shows a cutaway section of an embodiment of mid-line electrical connector (MLEC) 25 on pipeline 20. Wet-connect component 40A is shown inserted into mating component 40B. Conductor bar 50 is attached to the inner pipe. The shield on coaxial cables is connected to the body of wet-connect 40, which is directly in contact with the outer or casing pipe. Only one wet-connector may be necessary for pulse testing using the method and apparatus disclosed herein. Since relatively small currents may be used, these can be carried by shielding and cores of the coaxial cables. Before power is applied for heating the pipeline, wet-connector 40A may be removed by an ROV and the ROV retrieved. When power is applied for heating the pipeline, preferably after electrical integrity has been assured by TDR testing, two wet-connectors may be employed (not shown). A first wet-connector may be connected directly to the outside pipe from one side of MLEC 25 and a second wet-connector may be connected to the opposite side of MLEC 25 in place of component 40A. These are also placed by an ROV at great water depth.

The ROV TDR described above may have ten defined measurement ranges over which it splits each trace into 1,000 data points. Therefore, the resolution of a signal is limited to one thousandth of the range selected. The longer the pulse width the greater distance over which problems can be detected, so for each section a range of pulse widths will be used. The shorter pulse widths will be used for problems that may occur nearer the midline connector and the longer pulses will be used for problems that may exist closer to the steel bulkheads at the end of each segment. For example, the following table specifies the ranges for each of the pulse widths available from a ROV TDR:

TABLE 1

| Pulse width (ns) | Nominal range (m) |
| --- | --- |
| 5 | 50 |
| 10 | 100 |
| 20 | 200 |
| 50 | 400 |
| 200 | 1000 |
| 750 | 2000, 4000 |
| 3000 | 7500, 15000, 30000 |

The normal ranges listed above are calculated assuming a relative propagation velocity of one, i.e., a propagation velocity equal to the velocity of light in a vacuum. Pulse signals travel slower in transmission lines, and a TDR unit works with units of time, so the smaller velocity in a transmission line must be used to proportionately reduce the nominal range indicated by a TDR unit for that transmission line. Using a measured time for receiving a reflected pulse from a known distance from a mid-line electrical connector, the propagation velocity of pulses in a pipeline segment of interest can be measured. Using this propagation velocity, the distance to an event of interest, such as a change in pulse form occurring at a measured time, can be calculated.

Open circuit tests of the cable assembly may be performed prior to the ROV leaving the vessel and again once the ROV has reached the sea floor. In this way, it is possible to asses any changes to the TDR cable assembly. A pulse width of about 50 ns may be used when testing the cable assembly. If the cable assembly is shown not to be damaged then the plug may be reconnected to the correct socket on the MLEC and the segment retested.

Problems with a MLEC could result from a poor electrical connection through the wet-mate receptacles, water ingress into the annulus space or damage to the inner pipe connection either becoming detached or shorting to the MLEC casing. Saltwater breach near one of the steel bulkheads, although unlikely, will be one of the more difficult problems to detect as the signal strength from the bulkhead may be low for many applications and the reflected pulses may be subjected to considerable broadening. A saltwater breach at any location along the pipeline would be observed as a short circuit. The farther away from the steel bulkhead the better the chance of pinpointing a location. The steel bulkhead may still be observed from the reflected signal from the undamaged side of the pipeline segment. The ability to locate which side of the midline connector the pipeline is damaged is improved as the pipeline on each side of the MLEC becomes more asymmetric.

Figure 6:
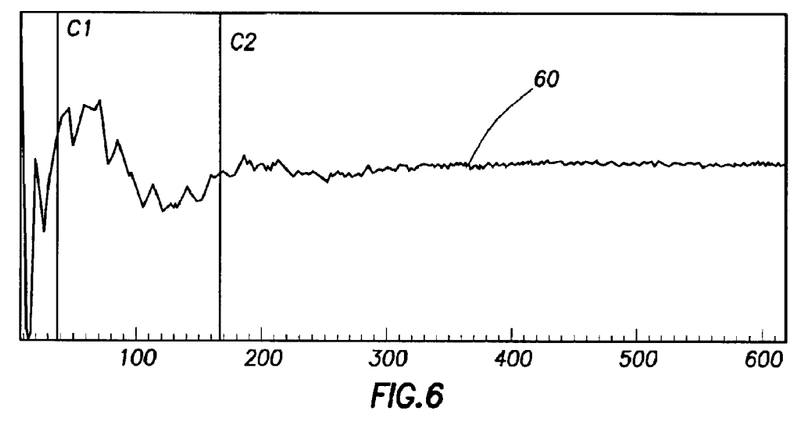
FIG. 6 illustrates an example pulse form resulting from a test run with a 20 ns pulse width in a bundle of coaxial cables.
Figure 7:
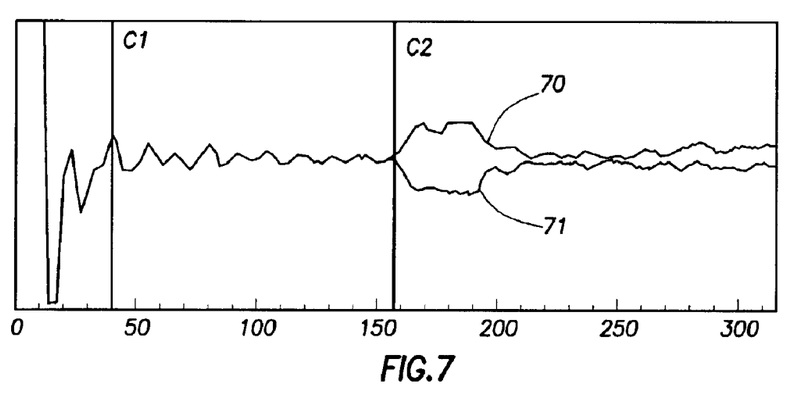
FIG. 7 illustrates an example pulse form resulting from a test run with a 20 ns pulse width in a bundle of coaxial cables and with an open circuit and a short circuit at the end of the cables.
Figure 8:
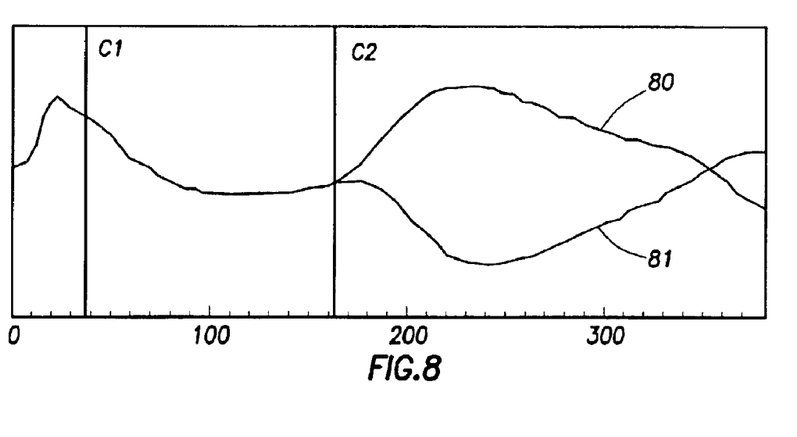
FIG. 8 illustrates an example pulse form resulting from a test run with a 200 ns pulse width in a bundle of coaxial cables and with an open circuit and a short circuit at the end of the cables.

FIGS. 6, 7 and 8 represent sample pulse forms taken during testing of the present invention. FIG. 6 displays the resulting form from a sample pulse sent through a shielded connector coaxial cable bundle of four cables. Each time the impedance of the coaxial cable bundle changes slightly, a fraction of the pulse reflects back to the TDR unit. The TDR unit stores the pulse forms and returns the resulting pulse form display. Each small bump in wave form 60 represents a reflection from the tested system. TDR unit 35 sent a 20 ns pulse having an amplitude of 7 V through the coaxial cable bundle. The scale at the bottom of FIG. 6 shows the number of feet the pulse has traveled at a given point in the reflected pulse form. The form prior to point C1 represents the pulse signature of the Tronic wet-mateable assembly. Point C1 on the wave form shows the beginning of the coaxial cable bundle. Point C2 marks the end of the coaxial cable bundle. By subtracting C1 from C2, TDR operators can determine the length of the coaxial cable (assuming the correct propagation velocity has been used). In this case, the length is indicated to be 129 feet. The distance to any defects in the pipeline can be determined in the same manner, assuming the propagation velocity is set correctly.

FIG. 7 illustrates two superimposed pulse forms taken from a 20 ns initial pulse sent down the same coaxial cables as in FIG. 6. However, pulse form 70 was taken from a coaxial cable bundle that terminates at C2 in an open circuit condition. Pulse form 71 results from a coaxial cable bundle with a short circuit at the terminating end. As shown by FIG. 7, open circuit conditions return pulse forms with positive amplitude reflections, while closed circuit conditions return pulse forms with negative amplitude reflections. Again, the locations of the short circuit and open circuits can be determined by subtracting the location of the start of the cable from the location of the reflected pulse forms, accounting for the various propagation velocities of the bundle of coaxial cables and the cable from the TDR. The locations of defects such as short circuits in the pipeline can be determined in the same manner. Short circuits in the pipeline will display negative amplitude reflections similar to those of pulse form 71. FIG. 8 illustrates the pulse form that results from an initial 200 ns pulse sent down the same coaxial cable configuration of FIG. 7. Pulse form 80 shows an open circuit condition; pulse form 81 shows a closed circuit condition. The greater pulse width broadens the reflected pulses and would decrease the spatial resolution for finding a defect in a pipeline.

While particular embodiments of the present invention have been described, it is not intended that these details should be regarded as limitations on the present invention, except to the extent that they are included in the appended claims. It should be understood that various changes, substitutions and alterations can be made hereto without departing from the spirit and the scope of the invention as defined by the appended claims.

What is claimed is:

1. A method for testing for an electrical defect in a segment of an electrical-ready pipe-in-pipe subsea pipeline, the segment having an inner pipe and a concentric outer pipe electrically connected by conducting bulkheads at each end of the segment, comprising:

placing a time domain reflectometer in proximity to a mid-line electrical connector in the segment, the reflectometer being located in a watertight enclosure capable of withstanding a selected external pressure;

electrically connecting a wet-mateable connector between the time domain reflectometer and the mid-line electrical connector in the segment, the mid-line electrical connector being separately electrically connected to the inner pipe and to the outer pipe;

supplying electrical power to the reflectometer to initiate the reflectometer so as to send an electrical pulse of a selected voltage amplitude in the range of 1–10,000 volts and width through the wet-mateable connector to the inner pipe and collecting at the reflectometer a reflected electrical signal through the wet-mateable connector;

transmitting the reflected electrical signal from the reflectometer to an interface; and interpreting the reflected electrical signal to test for the electrical defect.

2. The method of claim 1 wherein the wet-mateable connector is placed between the time domain reflectometer and the mid-line electrical connector on the pipeline by a remotely operated vehicle.

3. The method of claim 1 wherein the electrical power is supplied to the reflectometer from a ship stationed above the reflectometer.

4. The method of claim 1 wherein the reflected electrical signal from the time domain reflectometer is transmitted to the interface by a signal through an umbilical attached to an ROV.

5. The method of claim 1 wherein the reflected electrical signal to test for the electrical defect is interpreted by observing one or more positive- or negative-amplitude pulses and determining their times of arrival at the mid-line electrical connector.

6. The method of claim 1 wherein the reflected electrical signal to test for the electrical defect is interpreted by comparing the signal with a previously observed electrical signal from the same segment.

7. The method of claim 1 wherein the selected width of the electrical pulse sent through the wet-mateable connector to the inner pipe is in the range from about 5 ns to about 5,000 ns.

8. The method of claim 1 further comprising the step of adjusting an impedance-matching device between the time domain reflectometer and the mid-line electrical connector.

9. Apparatus for testing for an electrical defect in a segment of an electrical-ready pipe-in-pipe subsea pipeline, comprising:

a time domain reflectometer, the reflectometer being located in a water-tight enclosure capable of withstanding a selected external pressure and being adapted for attachment to a remotely operated vehicle;

a first component of a wet-mateable connector adapted to mate with a second component of the wet-mateable connector, the first component being electrically and mechanically connected to a cable from the water-tight enclosure to the first component; and control, power supply and interface apparatus for powering and operating the time domain reflectometer, said time domain reflectometer capable of applying an electrical pulse having an amplitude in the range of 1–10,000 volts for a selected period of time.

10. The apparatus of claim 9 further comprising apparatus for matching characteristic impedance of the time domain reflectometer.

11. The apparatus of claim 9 further comprising the remotely operated vehicle.

* * * * *